United States Patent
Dahilig et al.

(10) Patent No.: US 8,120,187 B2
(45) Date of Patent: **\*Feb. 21, 2012**

(54) INTEGRATED CIRCUIT PACKAGE SYSTEM EMPLOYING DEVICE STACKING AND METHOD OF MANUFACTURE THEREOF

(75) Inventors: Frederick Rodriguez Dahilig, Singapore (SG); Sheila Marie L. Alvarez, Singapore (SG); Antonio B. Dimaano, Jr., Singapore (SG); Dioscoro A. Merilo, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/892,941

(22) Filed: Sep. 29, 2010

(65) Prior Publication Data

US 2011/0012270 A1    Jan. 20, 2011

Related U.S. Application Data

(63) Continuation of application No. 11/766,787, filed on Jun. 21, 2007, now Pat. No. 7,830,020.

(51) Int. Cl.
*H01L 23/48* (2006.01)
*H01L 29/41* (2006.01)
*H01L 21/58* (2006.01)
*H01L 21/60* (2006.01)

(52) U.S. Cl. ........ 257/777; 257/678; 257/728; 438/110; 438/119; 438/114; 438/462; 438/109

(58) Field of Classification Search .......... 257/678–743, 257/777; 438/106–108, 110, 113, 114, 460, 438/462, 464, 465
See application file for complete search history.

(56) References Cited

U.S. PATENT DOCUMENTS

| | | | |
|---|---|---|---|
| 6,593,545 | B1 | 7/2003 | Greenwood et al. |
| 6,773,961 | B1 | 8/2004 | Lee et al. |
| 7,164,202 | B2 | 1/2007 | Wang et al. |
| 7,830,020 | B2 * | 11/2010 | Dahilig et al. ............. 257/777 |
| 2004/0251557 | A1 | 12/2004 | Kee |
| 2005/0012212 | A1 | 1/2005 | Gilleo |
| 2007/0057367 | A1 | 3/2007 | Song et al. |
| 2008/0079130 | A1 | 4/2008 | Ha et al. |
| 2008/0135989 | A1 | 6/2008 | Jang et al. |

OTHER PUBLICATIONS

Notice of Allowance for TW Application No. 97119625 dated Dec. 1, 2011.

* cited by examiner

*Primary Examiner* — Mary Wilczewski
*Assistant Examiner* — Telly Green
(74) *Attorney, Agent, or Firm* — Mikio Ishimaru

(57) ABSTRACT

A method of manufacture of an integrated circuit package system that includes: providing an electrical interconnect system including an inner lead-finger system and an outer lead-finger system; stacking a first device, a second device, and a third device between and over the electrical interconnect system; connecting the first device and the second device to the inner lead-finger system; and connecting the third device to the outer lead-finger system.

15 Claims, 4 Drawing Sheets

INTEGRATED CIRCUIT PACKAGE SYSTEM EMPLOYING DEVICE STACKING AND METHOD OF MANUFACTURE THEREOF

CROSS-REFERENCE TO RELATED APPLICATION(S)

This is a continuation of U.S. patent application Ser. No. 11/766,787 filed Jun. 21, 2007, now U.S. Pat. No. 7,830,020.

TECHNICAL FIELD

The present invention relates generally to integrated circuits, and more particularly to an integrated circuit package system employing device stacking.

BACKGROUND ART

Integrated circuits and integrated circuit package systems can be found in a multitude of electronic devices, such as cell phones, pocket PCs, digital cameras, automobile engines, and many other portable/wireless products. Today's customers and electronics systems are demanding that these integrated circuit systems provide maximum functional integration of memory and logic within the smallest footprint, lowest profile, and lowest cost package available. Consequently, manufacturer's are turning to three-dimensional packaging to achieve the required high level of functional integration necessary to support these mobile electronic products.

Various techniques have been developed to meet the continued demands for improving functional integration and circuit density within a three-dimensional package. Unfortunately, leadframe based three-dimensional packages have lagged in their ability to handle the increase in circuit density required of high level functionally integrated systems. Typically, leadframe packaging has its limit when providing acceptable solutions for three-dimensional integration due to factors such as, increased package thickness, a larger footprint area, and insufficient input/output leads to handle the higher circuit density.

Thus, a need still remains for a reliable integrated circuit package system and method of fabrication, wherein the integrated circuit package system permits high density three-dimensional device stacking within the same interconnect level. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers are found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: providing an electrical interconnect system including an inner lead-finger system and an outer lead-finger system; stacking a first device, a second device, and a third device between and over the electrical interconnect system; connecting the first device and the second device to the inner lead-finger system; and connecting the third device to the outer lead-finger system.

The present invention provides an integrated circuit package system, including: an electrical interconnect system including an inner lead-finger system and an outer lead-finger system; a first device, a second device, and a third device between and over the electrical interconnect system; the first device and the second device electrically connected to the inner lead-finger system; and the third device electrically connected to the outer lead-finger system.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
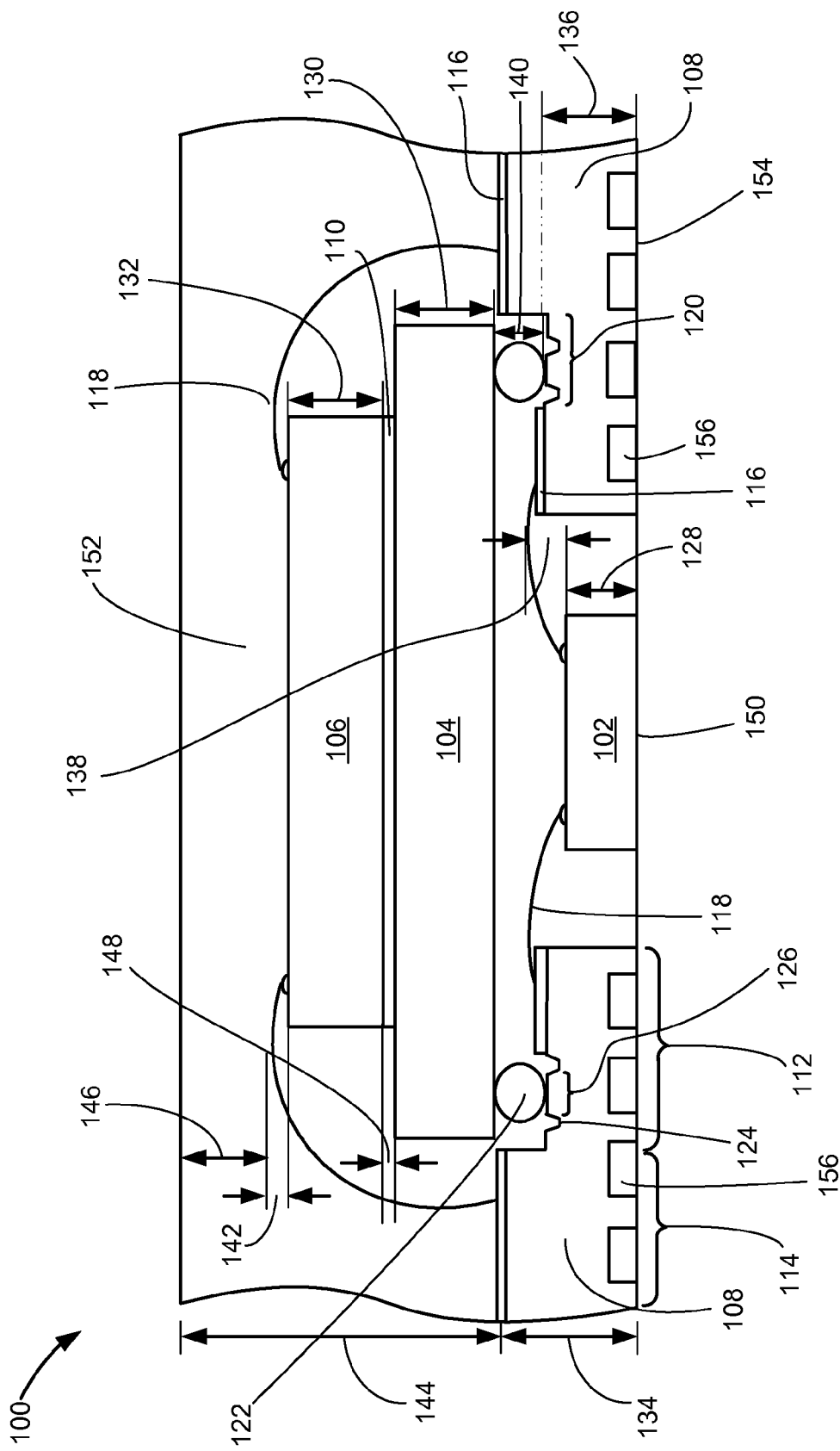
FIG. 1 is a cross-sectional view of an integrated circuit package system, in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of an electrical interconnect system, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The terms "processed" or "processing" as used herein includes deposition of material or photoresist, patterning, exposure, development, etching, cleaning, and/or removal of the material or photoresist as required in forming a described structure.

The terms "half-etched", "half-etching", "stamped" or "stamping" as used herein includes removing a portion of an electrical interconnect system in a thickness direction that may be substantially equivalent to half, less than half, or greater than half of the thickness of the electrical interconnect system. However, in no event will "half-etched", "half-etching", "stamped" or "stamping" be defined to include removal of the entire thickness of the electrical interconnect system.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first", "second", and "third" as used herein are for purposes of differentiation between elements only and are not to be construed as limiting the scope of the present invention.

Referring now to FIG. 1 therein is shown a cross-sectional view of an integrated circuit package system 100, in accordance with an embodiment of the present invention. As an exemplary illustration, the integrated circuit package system 100 may generally be used within a portable electronics device that requires a high level of functional integration, such as a cell phone or computer.

The integrated circuit package system 100 includes a first device 102, a second device 104 and a third device 106 stacked between and/or over an electrical interconnect system 108. By way of example, each of the first device 102, the second device 104 and the third device 106 may include semiconductor chips and integrated circuit packages selected from active components, passive components, processor components, memory components, logic components, digital components, analog components, power components, and so forth, in numerous configurations and arrangements as may be needed. As exemplary illustrations, each of the first device 102, the second device 104 and the third device 106 may more specifically include a digital signal processor, an application specific integrated circuit, a flip-chip configuration, a graphical processor unit, flash memory, dynamic random access memory (DRAM), magnetic random access memory (MRAM), static random access memory (SRAM), an optical sensor device, a micro-electro-mechanical device, a radio frequency (RF) device, and/or a combination thereof.

Furthermore, it is to be understood that each of the first device 102, the second device 104, and the third device 106 may also include Package-in-Package (PiP) and Package-on-Package (PoP) configurations. The PiP system is a 3D package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board and/or electrical interconnect mount process.

In accordance with the present invention each of the first device 102, the second device 104 and the third device 106 covers a wide range of semiconductor chip and integrated circuit package configurations involving various types, sizes, dimensions, and electrical contact techniques, and the kind of chip or package configuration employed should only be limited by the design specifications of the integrated circuit package system 100.

An inter-device structure 110 may separate the second device 104 and the third device 106. The inter-device structure 110 may include an adhesive with or without thermally conducting capabilities, a spacer, an electromagnetic interference shield for blocking potentially disruptive energy fields, or a combination thereof. For example, if the inter-device structure 110 is an adhesive layer, the adhesive layer may include a film or a partially unconsolidated (e.g.—a liquid or a gel) adhesive material, which allows the third device 106 to self-align over the second device 104. Furthermore, if the inter-device structure 110 is an adhesive layer, the adhesive layer can be deposited in any pattern or shape (e.g.—a zero fillet configuration), which facilitates the adhesion of the third device 106 to the second device 104.

The electrical interconnect system 108 may include a lead-finger system defined by an inner lead-finger system 112 and an outer lead-finger system 114. The outer lead-finger system 114 is typically formed integrally with the inner lead-finger system 112 and the outer lead-finger system 114 may extend from the package body for establishing an external electrical connection. For purposes of illustration, the electrical interconnect system 108 can be made from a conducting material such as copper.

By way of example, the electrical interconnect system 108 may include a thin metal sheet, a conductive plated pattern on plastic tape, or any structure suitable for supporting and/or electrically interconnecting the first device 102, the second device 104, and the third device 106 to external electrical circuits. For purposes of illustration, the electrical interconnect system 108 can be exemplified by a leadframe with a lead-finger system including single in-line leads, dual in-line leads, quad flat pack leads, gull-wing leads, j-leads, leadless leads that wrap around the package edge to maintain a low profile, pin grid array leads, or ball grid array leads. However, it is to be understood that the present invention is not to be limited to these examples. In accordance with the present invention, the electrical interconnect system 108 may include any electrical interconnection structure (i.e.—leads) that facilitates the incorporation of the integrated circuit package system 100 into a higher-level assembly, such as a printed circuit board or other suitable structure for supporting the integrated circuit package system 100.

In an aspect of a preferred embodiment, the electrical interconnect system 108 may include a single row or dual row lead/land configuration that has been half-etched or stamped. More specifically, the electrical interconnect system 108 may include a single row or dual row lead/land configuration, wherein the inner lead-finger system 112 has been half-etched or stamped for purposes of subsequently forming a wire bond contact 116 and a bump contact 120.

The wire bond contact 116 can be used for electrically interconnecting each of the first device 102 and the third device 106 to external electrical circuits through the electrical interconnect system 108. The wire bond contact 116 may include a region pre-plated with, but not limited to, nickel, palladium, lead, tin, gold, and alloys thereof. By way of example, the wire bond contact 116 can be electrically attached to the first device 102 and the third device 106 by a wire bond 118. The wire bond 118 can be deposited using materials and techniques well known within the art and is currently only limited by the technology of wire bond equipment and the minimum required operating space.

The bump contact 120 can be used for electrically interconnecting the second device 104 to external electrical circuits through the electrical interconnect system 108. By way of example, the bump contact 120 can be electrically attached to the second device 104 by a bump bond 122. Notably, the bump contact 120 of the present invention includes a groove 124 formed adjacent a mesa 126. In an aspect of a preferred embodiment, the mesa 126 can be defined by the groove 124, as the depth of the groove 124 is substantially equal to the height of the mesa 126.

Although, the present embodiment depicts the groove 124 formed on opposing sides of the mesa 126, it is to be understood that the groove 124 may be formed on one or more sides of the mesa 126 or continuously around the mesa 126. Further, it is to be understood that one or more of the groove 124 may be formed per side of the mesa 126. Moreover, the groove 124 may include any design or shape, such as circular, triangular, or rectangular, for example. Furthermore, the depth of the groove 124 is not to be limited to the height of the mesa 126 and may include any depth that helps to minimize electrical shorting occurrences.

Those skilled in the art will recognize that the mesa 126 can be configured to receive the bump bond 122 and that the groove 124 can be designed to accommodate excess solder that flows off of the mesa 126 during reflow, thereby helping to prevent electrical shorts caused by the migration of excess solder. Furthermore, it is to be understood that the groove 124 and the mesa 126 may further include a combination of solder wettable and solder non-wettable regions configured and engineered to reduce the occurrence of electrical shorts from excess solder.

Hereinafter, exemplary package dimensions are provided for the integrated circuit package system 100, however, it is to be understood that these dimensions are provided merely for purposes of illustration and are not to be construed as limiting the scope of the present invention or the claims appended hereto. By way of example, the integrated circuit package system 100 may possess the following dimensions: a first device thickness 128 of about 0.1 millimeters; a second device thickness 130 of about 0.15 millimeters; a third device thickness 132 of about 0.1 to about 0.15 millimeters; an outer lead-finger system thickness 134 of about 0.2 millimeters; an inner lead-finger system thickness 136 of about 0.15 millimeters; a first device loop height 138 of about 0.075 millimeters; a second device bump height 140 of about 0.1 millimeters; a third device loop height 142 of about 0.15 millimeters; a mold cap height 144 of about 0.65 millimeters; a mold cap clearance height 146 of about 0.1 millimeters; and an inter-device structure height 148 of about 0.01 to about 0.05 millimeters.

Notably, the electrical interconnect system 108 of the integrated circuit package system 100 does not include a paddle. By eliminating the need for a paddle, the profile of the integrated circuit package system 100 is greatly reduced. However, it is to be understood that the scope of the present invention may include the use of a paddle for purposes of structural stability, for example.

Moreover, the profile of the integrated circuit package system 100 can be further reduced by employing thin and ultra-thin devices for the first device 102, the second device 104, and the third device 106. Through the use of thin and ultra-thin devices, the integrated circuit package system 100 may achieve a package height of about one millimeter or less, even when employing similarly sized devices or differently sized devices for the second device 104 and the third device 106. Notably, this reduced profile package design of the integrated circuit package system 100 naturally improves the thermal dissipation ability of the integrated circuit package system 100 because the heat flux of a solid object is inversely proportional to the thickness of the object, noting Fourier's law of heat conduction in solids.

Additionally, the present invention further enhances the thermal dissipation ability of the integrated circuit package system 100 by exposing a first device backside 150 to an external environment. This improved thermal dissipation ability can be further enhanced by attaching a thermally conductive substrate or a heat sink adjacent the first device backside 150. By improving the ability of the integrated circuit package system 100 to dissipate heat, the reliability and the useful life of the integrated circuit package system 100 can be improved.

Moreover, it is to be understood that standard packages or devices may be used for the first device 102, the second device 104, and the third device 106, thereby reducing the cost of manufacturing the integrated circuit package system 100.

Another notable aspect of the present invention is that it allows for testing of the first device 102, the second device 104 and the third device 106 before adhering them to the electrical interconnect system 108, therefore ensuring the use of known good die or packages in the manufacturing process. Additionally, after adhering the first device 102, the second device 104, and the third device 106 to the electrical interconnect system 108, these assemblies can also be tested before incorporation into additional package systems. This ensures that the final product includes known good assemblies, and thereby improves the manufacturing process yield for packaging.

An encapsulation material 152, such as a plastic molding compound, is deposited over the integrated circuit package system 100. Notably, the encapsulation material 152 does not cover at least a portion of an electrical interconnect system bottom side 154 and at least a portion of the first device backside 150. By leaving the electrical interconnect system bottom side 154 and the first device backside 150 exposed to the external environment, the ability of the integrated circuit package system 100 to dissipate heat is greatly improved. Furthermore, by exposing the electrical interconnect system bottom side 154, the integrated circuit package system 100 may optionally include an electrical contact 156 for permitting a higher density concentration of input/output leads.

Moreover, the encapsulation material 152 not only protects the integrated circuit package system 100 from the external environment but it may also provide overall structural support and stability to the integrated circuit package system 100. The encapsulation material 152 and molding techniques using it are well known in the art and not repeated herein.

FIGS. 2-8, which follow, depict by way of example and not by limitation, an exemplary process flow for the formation of the integrated circuit package system 100, of FIG. 1, and they are not to be construed as limiting. Accordingly, it is to be understood that many modifications, additions, and/or omissions may be made to the below described process flow without departing from the scope or spirit of the claimed subject matter. For example, the process may include more, fewer, or other steps. Additionally, since the structure and elements of FIGS. 2-8 are the same as the structure and elements of FIG. 1, identical numerals have been used and explanations thereof are omitted.

Although FIGS. 2-8 depict the formation of one of the integrated circuit package system 100, it is to be understood that one or more of the integrated circuit package system 100 can be prepared at one time on a support structure, which could then be separated into individual or multiple semiconductor assemblies at a later stage of fabrication.

Figure 2:
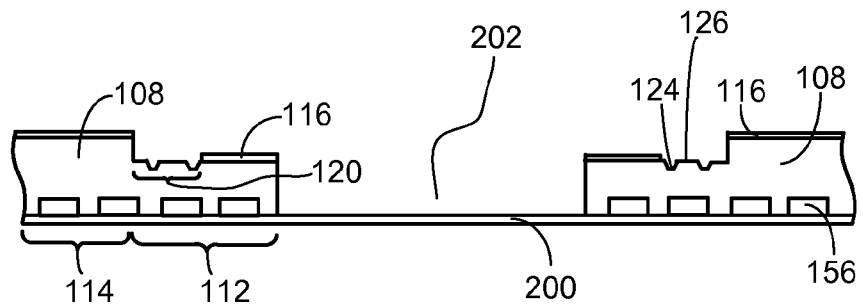
FIG. 2 is a cross-sectional view of an integrated circuit package system, of FIG. 1, in an initial stage of manufacture, in accordance with an embodiment of the present invention.

Referring now to FIG. 2, therein is shown a cross-sectional view of the integrated circuit package system 100, of FIG. 1, in an initial stage of manufacture, in accordance with an embodiment of the present invention. The electrical interconnect system 108 includes the inner lead-finger system 112, the outer lead-finger system 114, the wire bond contact 116, the bump contact 120, the groove 124, the mesa 126, and the electrical contact 156.

This cross-sectional view depicts attaching the electrical interconnect system 108 to a support medium 200, such as a tape that is part of a tape and reel configuration, for example. However, it is to be understood that the support medium 200 is not limited to the preceding example and the support medium 200 may include any structure that helps to support the electrical interconnect system 108 during manufacture.

An opening 202 is provided within the electrical interconnect system 108. The opening 202 provides a recess for the subsequent placement of the first device 102, of FIG. 1, between portions of the inner lead-finger system 112. Generally, the perimeter or dimensions of the opening 202 are defined by the inner lead-finger system 112. It is to be understood that the dimensions of the opening 202 can be minimized to help reduce the overall footprint of the integrated circuit package system 100 or the dimensions of the opening 202 can be made larger to help reduce per unit product costs, for example.

By way of example, the opening 202 can be formed within the electrical interconnect system 108 by punching or etching.

Figure 3:
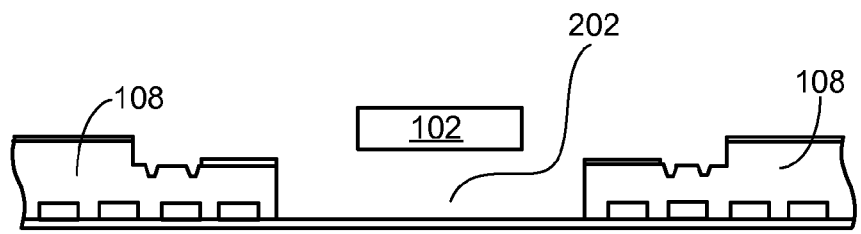
FIG. 3 is the structure of FIG. 2 during placement of a first device.

Referring now to FIG. 3, therein is shown the structure of FIG. 2 during placement of the first device 102. Per this embodiment, the first device 102 is centrally aligned within the opening 202 of the electrical interconnect system 108.

Figure 4:
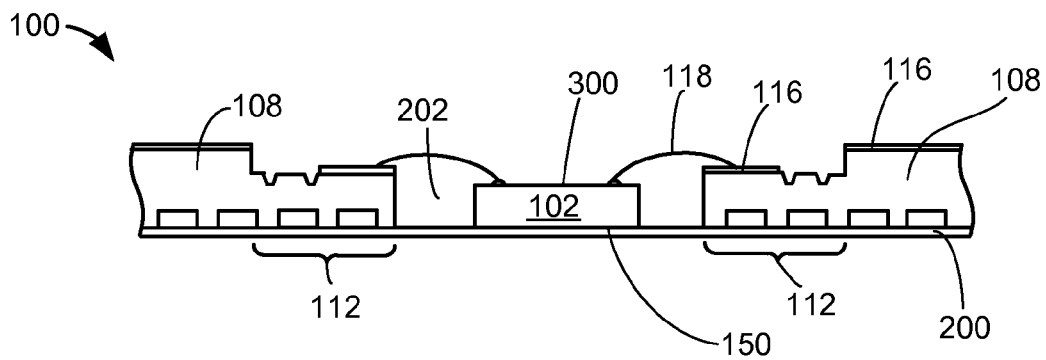
FIG. 4 is the structure of FIG. 3 after attachment of a first device and formation of a wire bond.

Referring now to FIG. 4, therein is shown the structure of FIG. 3 after attachment of the first device 102 and formation of the wire bond 118. Per this embodiment, the first device 102 is attached to the support medium 200 and the wire bond 118 is formed. Generally, the placement or location of the first device 102 can be described as between the inner lead-finger system 112.

Notably, the surface of the electrical interconnect system 108 attached to the support medium 200 is substantially coplanar with the first device backside 150. By allowing the first device 102 to be mounted within the opening 202 of the electrical interconnect system 108, the overall dimensions of the integrated circuit package system 100 may be reduced by utilizing the thickness of the electrical interconnect system 108 to accommodate the first device 102.

A first device active side 300 has been left exposed for further processing steps, such as wire bonding. Notably, the wire bond 118 between the first device 102 and the wire bond contact 116 of the inner lead-finger system 112 can exhibit a low loop height due to the half-etch profile employed on the inner lead-finger system 112.

Figure 5:
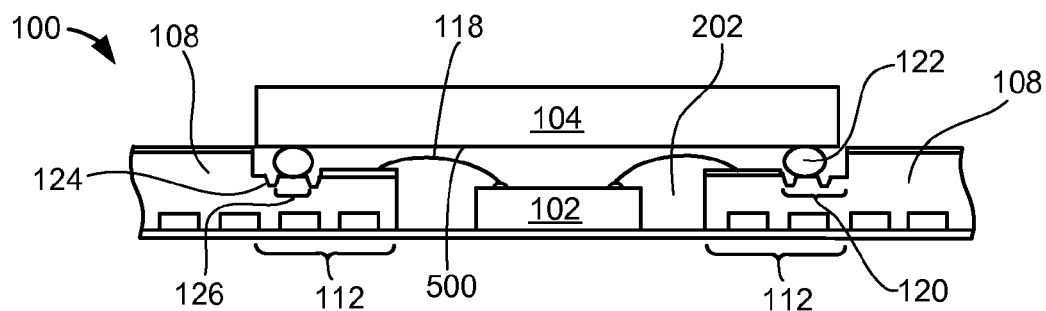
FIG. 5 is the structure of FIG. 4 after placement of a second device.

Referring now to FIG. 5, therein is shown the structure of FIG. 4 after placement of the second device 104. Per this embodiment, the second device 104, which may include a flip-chip device, is formed over the first device 102, the opening 202, and the inner lead-finger system 112. The second device 104 is electrically attached to the bump contact 120 via the bump bond 122. Preferably, the bump bond 122 should possess a height sufficient to provide clearance between a second device bottom side 500 and the wire bond 118 of the first device 102.

During attachment, the bump bond 122 of the second device 104 is aligned over the bump contact 120. More specifically, the bump bond 122 can be aligned over and electrically connected to the mesa 126 by targeting the mesa 126; or, the bump bond 122 can be aligned over and electrically connected to the mesa 126 by targeting the bump bond 122 placement between each of the groove 124. Notably, by forming the second device 104 over the inner lead-finger system 112, the overall profile or height of the integrated circuit package system 100 can be reduced by utilizing the reduced thickness portion of the electrical interconnect system 108.

Figure 6:
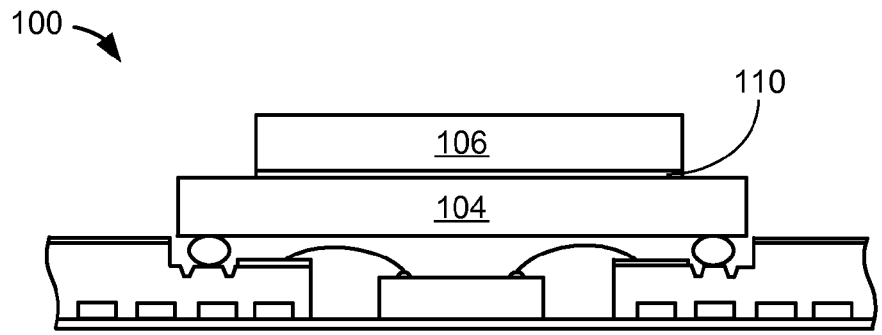
FIG. 6 is the structure of FIG. 5 after placement of a third device.

Referring now to FIG. 6, therein is shown the structure of FIG. 5 after placement of the third device 106. The third device 106 is aligned over and attached to the second device 104 via the inter-device structure 110 (i.e.—the inter-device structure 110 is formed between the second device 104 and the third device 106). Although the third device 106 is depicted as smaller in size than the second device 104, it is to be understood that the third device 106 may be the same size or even slightly larger than the second device 104 to maximize the circuit density within the integrated circuit package system 100.

Figure 7:
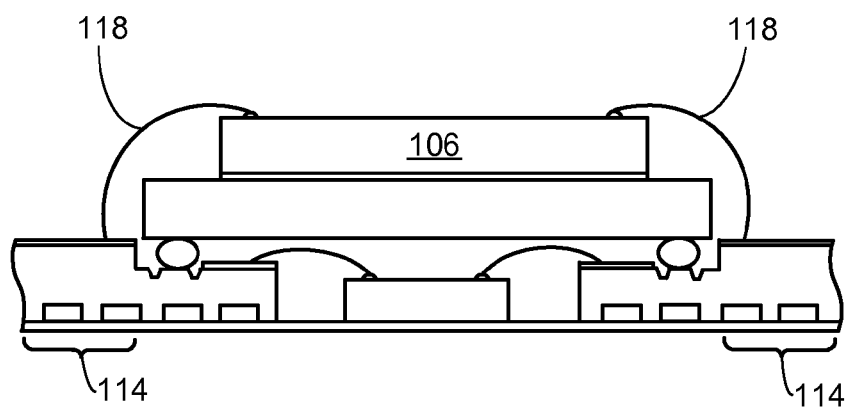
FIG. 7 is the structure of FIG. 6 after formation of a wire bond.

Referring now to FIG. 7, therein is shown the structure of FIG. 6 after formation of the wire bond 118. The wire bond 118 is formed between the third device 106 and the outer lead-finger system 114.

Figure 8:
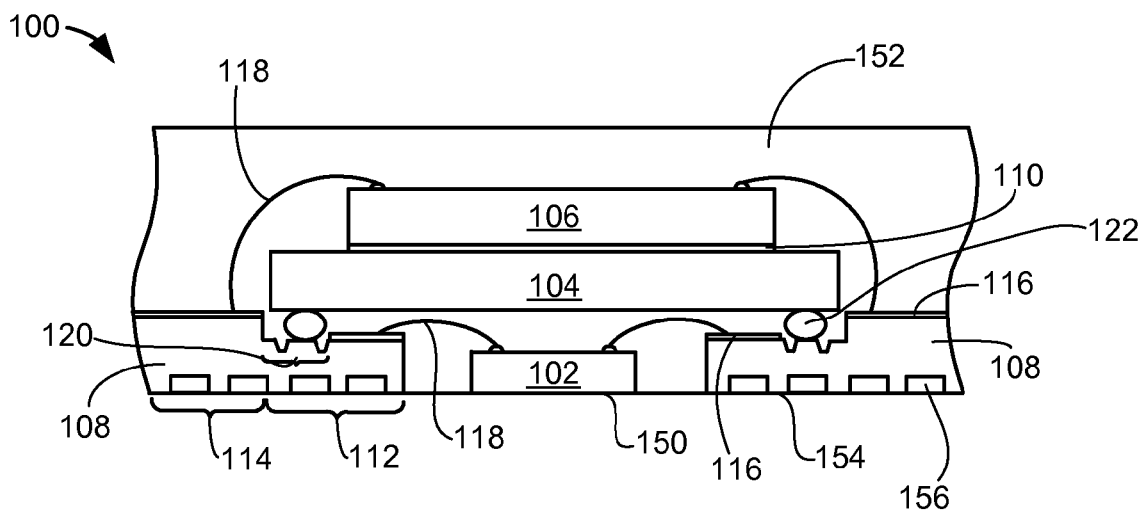
FIG. 8 is the structure of FIG. 7 after formation of an encapsulation material.

Referring now to FIG. 8, therein is shown the structure of FIG. 7 after formation of the encapsulation material 152. The encapsulation material 152 covers the first device 102, the second device 104, the third device 106, the electrical interconnect system 108, the inter-device structure 110, the inner lead-finger system 112, the outer lead-finger system 114, the wire bond 118, the bump bond 122, and portions of the wire bond contact 116 and the bump contact 120. Notably, due to the support medium 200, of FIG. 7, this molding process leaves the first device backside 150 and the electrical interconnect system bottom side 154 exposed after removal of the support medium 200.

After removal of the support medium 200 the integrated circuit package system 100 can be singulated from the electrical interconnect system 108 along tie bar removal lines (not shown). After singulation, the integrated circuit package system 100 will exhibit or possess the characteristics of singulation along its peripheral edges. The characteristics of singulation may include physical features, such as microabrasions, which are indicative of a lasing or mechanical dicing process.

Additionally, before or after singulation, a post mold cure process can be performed to strengthen the encapsulation material 152. Moreover, if desired, the electrical contact 156 formed on the electrical interconnect system bottom side 154 may undergo an optional plating process for improved conductivity and bonding.

Figure 9:
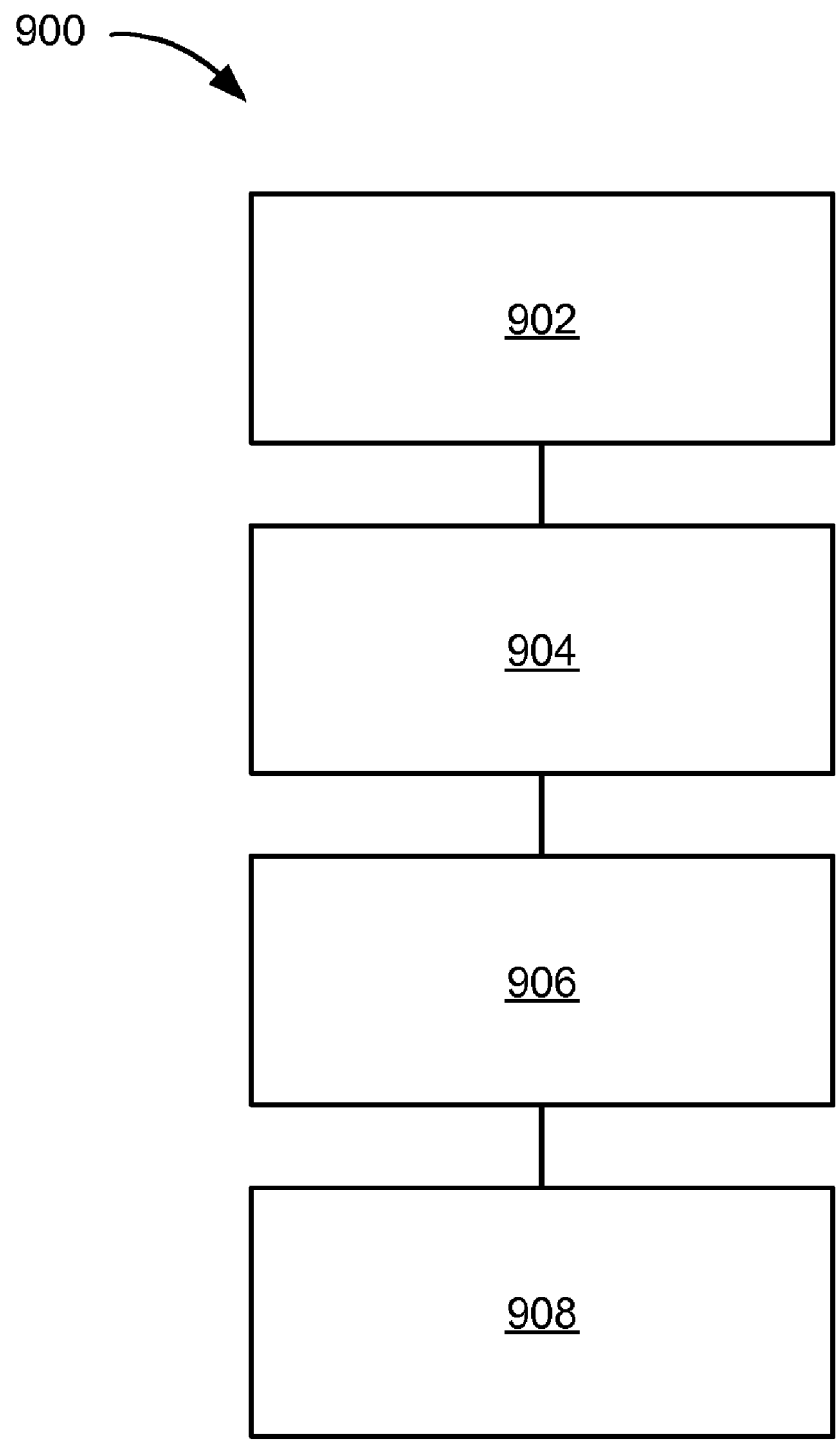
FIG. 9 is a flow chart of an integrated circuit package system for an integrated circuit package system in accordance with an embodiment of the present invention.

Referring now to FIG. 9, therein is shown a flow chart of an integrated circuit package system 900 for the integrated circuit package system 100 in accordance with an embodiment of the present invention. The integrated circuit package system 900 includes providing an electrical interconnect system including an inner lead-finger system and an outer lead-finger system in a block 902; stacking a first device, a second device, and a third device between and over the electrical interconnect system in a block 904; connecting the first device and the second device to the inner lead-finger system in a block 906; and connecting the third device to the outer lead-finger system in a block 908.

It has been discovered that the present invention thus has numerous aspects. One such aspect is that the present invention provides a simplified device stacking process within a reduced profile package. The present invention achieves this through a combination of wire bonding, bump bonding, lead half-etching, and by forming a device within an opening of the electrical interconnect system.

Another aspect of the present invention is that it provides a reduced profile package with enhanced circuit density while employing a single electrical interconnect level system. The present invention achieves this by stacking three separate devices between and over a single electrical interconnect system.

Another aspect of the present invention is that it enhances the thermal dissipation ability of an integrated circuit package system. The present invention achieves this by exposing a device backside to an external environment for improved thermal dissipation.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for enhancing circuit density within the same interconnect level. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
providing an electrical interconnect system including an inner lead-finger system and an outer lead-finger system;
stacking a first device, a second device, and a third device between and over the electrical interconnect system;
connecting the first device and the second device to the inner lead-finger system; and
connecting the third device to the outer lead-finger system.

2. The method as claimed in claim 1 wherein:
providing the electrical interconnect system includes half etching or stamping the electrical interconnect system to form the inner lead-finger system.

3. The method as claimed in claim 1 further comprising:
exposing a first device backside to an external environment.

4. A method of manufacture of an integrated circuit package system comprising:
providing an electrical interconnect system including an inner lead-finger system and an outer lead-finger system over a support medium;
attaching a first device to the support medium within an opening defined by the inner lead-finger system;
connecting the first device to the inner lead-finger system;
connecting a second device to the inner lead-finger system;
attaching a third device to the second device;
connecting the third device to the outer lead-finger system;
removing the support medium; and
encapsulating the integrated circuit package system.

5. The method as claimed in claim 4 wherein:
providing the electrical interconnect system includes providing the inner lead-finger system with a wire bond contact and a bump contact.

6. The method as claimed in claim 4 wherein:
providing the electrical interconnect system includes providing the inner lead-finger system with a bump contact formed by a mesa and a groove.

7. The method as claimed in claim 4 further comprising:
forming an inter-device structure between the third device and the second device.

8. An integrated circuit package system comprising:
an electrical interconnect system including an inner lead-finger system and an outer lead-finger system;
a first device, a second device, and a third device between and over the electrical interconnect system;
the first device and the second device electrically connected to the inner lead-finger system; and
the third device electrically connected to the outer lead-finger system.

9. The system as claimed in claim 8 wherein:
the second device is a flip-chip device.

10. The system as claimed in claim 8 wherein:
the inner lead-finger system has a portion removed within the thickness direction.

11. The system as claimed in claim 8 wherein:
the first device includes a first device backside exposed to an external environment.

12. The system as claimed in claim 8 wherein:
the inner lead-finger system includes a wire bond contact and a bump contact.

13. The system as claimed in claim 8 wherein:
the inner lead-finger system includes a bump contact formed by a mesa and a groove.

14. The system as claimed in claim 8 wherein:
the first device is within an opening in the electrical interconnect system.

15. The system as claimed in claim 8 further comprising:
an inter-device structure between the third device and the second device.

* * * * *